US 7,268,042 B2

(12) United States Patent
Hisamoto et al.

(10) Patent No.: US 7,268,042 B2
(45) Date of Patent: Sep. 11, 2007

(54) NONVOLATILE SEMICONDUCTOR MEMORY AND MAKING METHOD THEREOF

(75) Inventors: Digh Hisamoto, Tokyo (JP); Kan Yasui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 292 days.

(21) Appl. No.: 11/005,015

(22) Filed: Dec. 7, 2004

(65) Prior Publication Data

US 2005/0176202 A1 Aug. 11, 2005

(30) Foreign Application Priority Data

Feb. 10, 2004 (JP) .............................. 2004-033297

(51) Int. Cl.
*H01L 21/8247* (2006.01)
(52) U.S. Cl. .................... 438/267; 438/596; 438/683; 257/316; 257/E21.422; 257/E21.681; 365/182; 365/185.26
(58) Field of Classification Search ............... 438/267, 438/596, 683; 257/316, E21.422, E21.681; 365/182, 185.26
See application file for complete search history.

(56) References Cited

U.S. PATENT DOCUMENTS

| 5,879,999 | A | * | 3/1999 | Park et al. ................... 438/304 |
| 5,969,383 | A | * | 10/1999 | Chang et al. ................ 257/316 |
| 6,440,796 | B2 | * | 8/2002 | Sung .......................... 438/257 |
| 6,841,823 | B2 | * | 1/2005 | Lojek et al. ................. 257/316 |
| 7,132,718 | B2 | * | 11/2006 | Hisamoto et al. ............ 257/407 |
| 2001/0012662 | A1 | * | 8/2001 | Hsieh et al. ................. 438/257 |
| 2002/0001903 | A1 | * | 1/2002 | Borel et al. ................. 438/257 |
| 2002/0045319 | A1 | * | 4/2002 | Ogura et al. ................ 438/303 |
| 2003/0034518 | A1 | * | 2/2003 | Yoshikawa .................. 257/315 |
| 2003/0198086 | A1 | * | 10/2003 | Shukuri ................... 365/185.18 |
| 2005/0272235 | A1 | * | 12/2005 | Wu et al. ..................... 438/592 |

FOREIGN PATENT DOCUMENTS

JP          2002-231829          8/2002

OTHER PUBLICATIONS

Sze, "Nonvolatile Memory Devices", *Physics of Semiconductor Devices*, 2nd Edition, 1981, pp. 496-506.
Chen et al., "A Novel Flash Memory Device with S—Plit Gate Source Side Injection and ONO Charge Storage Stack (SPIN)", *Symposium on VLSI Technology Digest of Technical Papers*, 1997, pp. 63-64.
Wu et al., "A Novel High-Speed, 5-Volt Programming EPROM Structure", *IEEE International Electron Device Meeting*, 1986, pp. 584-587.
Chan et al, "The Impact of Gate—Induced Drain Leakage Current on MOSFET Scaling", *IEEE International Electron Device Meeting*, 1987, pp. 718-721.

* cited by examiner

*Primary Examiner*—B. William Baumeister
*Assistant Examiner*—Steven J. Fulk
(74) *Attorney, Agent, or Firm*—Miles & Stockbridge

(57) ABSTRACT

A nonvolatile semiconductor memory device of a split gate structure having a gate of low resistance suitable to the arrangement of a memory cell array is provided. When being formed of a side wall spacer, a memory gate is formed of polycrystal silicon and then replaced with nickel silicide. Thus, its resistance can be lowered with no effect on the silicidation to the selection gate or the diffusion layer.

9 Claims, 11 Drawing Sheets

NONVOLATILE SEMICONDUCTOR MEMORY AND MAKING METHOD THEREOF

CLAIM OF PRIORITY

The present application claims priority from Japanese application JP 2004-033297 filed on Feb. 10, 2004, the content of which is hereby incorporated by reference into this application.

BACKGROUND OF THE INVENTION

1. Field of the Invention

The present invention relates to semiconductor memory devices and making methods thereof and it particularly relates to a semiconductor memory device having a nonvolatile memory structure and a making method thereof.

2. Description of the Related Art

It is a nonvolatile memory that is one of integrated semiconductor memories assembled in a large scale integrated (LSI) device or chip. This is a device that retains memory information even after a power supply for an LSI chip is turned off and this is an extremely important device to use the LSI chip for various applications.

For the nonvolatile semiconductor device, the so-called float gate type memory or a memory using an insulative film is described in Physics of Semiconductor Devices, 2nd edition, pp 496 to 506 written by S. Sze, A. Wiley-Interscience Publication. According to the description, those memories using the insulative film, in which insulative films are laminated and charges are stored at the boundary thereof or traps in the insulative films, require no additional formation of a conductive film compared with the float gate type. Accordingly, it has been known that the memories can be formed with good matching to the CMOS LSI process.

However, since existent memories storing charges in the insulative films are required to conduct charge and discharge of electric charges while possessing sufficient charge retaining characteristics, they are difficult to realize. On the other hand, it has been proposed to rewrite the memory information by injecting charges of different polarity. The operation is described in Symposium VLSI Technology, p63, 1997. In this structure, a polycrystal silicon gate for memory operation and a gate for cell selection are formed separately. Further, similar descriptions are also found in U.S. Pat. No. 5,969,383.

It is considered that the memory cell structure is fundamentally based on the N-channel metal-oxide semiconductor (NMOS) two transistors in which comprising a memory gate 501 is disposed on the side of a selection gate 502 as shown in FIG. 1.

Diffusion layer electrodes 202 and 201 are disposed to face each other in a silicon substrate 101, and the selection gate 502 and the memory gate 501 are disposed between the electrodes 202, 201 by way of insulative films 902 and 901. Channels 302 and 301 are formed in the semiconductor substrate in association with the gates respectively. FIG. 2 shows the structure as an equivalent circuit. The gate insulative film 901 of the memory gate is formed as a structure of sandwiching a silicon nitride film between silicon oxide films, that is, the so-called MONOS structure (Metal Oxide Nitride Oxide Semiconductor (Silicon)). The gate insulative film 902 for the selection gate 502 is a silicon oxide film. The diffusion layer electrodes 202 and 201 are formed by using the selection gate and the memory gate as a mask respectively. In this case, the selection gate means a gate corresponding to the selection transistor 1 and the memory gate means a gate corresponding to the memory transistor 2 in the equivalent circuit.

It is considered that the basic operations of the memory cell include four stages of (1) writing, (2) erasing, (3) retaining, and (4) reading. However, nomination for the four states is used for typical operation, and writing and erasing may be called in the opposite manner depending on the view. Further, while the operations are explained also with respect to typical ones, various different operation methods may be conceivable. While a memory formed with the NMOS type is to be described for the sake of explanation, this can be formed in principle with the PMOS type in the same manner.

(1) Upon writing, a positive potential is applied to the diffusion layer electrode 201 on the side of the memory gate, and a ground potential identical with that for the substrate 101 is applied to the diffusion layer electrode 202 on the side of the selection gate. A gate overdrive voltage higher than that of the diffusion layer electrode 201 on the side of the memory gate is applied to the memory gate 501, to thereby turn on the channel 301 below the memory gate 501. In this case, the on-state is attained by setting the potential for the selection gate to a value higher by 0.1 to 0.2 V than the threshold value for the potential of the selection gate. At this time; since a most intense electric field is generated near the boundary between the two gates 901 and 902, many hot electrons are generated in this region and injected to the memory gate. This phenomenon has been known as a source side injection (SSI). The phenomenon is reported by A. T. Wu, et al. in IEEE International Electron Device Meeting, Technical Digest, in pp 584 to 587, 1986. While the float gate type memory is used, the injection mechanism is the same also in the insulative film type. The hot electron injection in this system is characterized in that since the electric field is concentrated near the boundary between selection gate and the memory gate, electrons are injected concentrically to the end of the memory gate on the side of the selection gate. Further, while the charge retention layer is formed of the electrode in the float gate type, since electrons are accumulated in the insulative film in the insulative film type, electrons are retained in an extremely narrow region.

(2) Upon erasing, a negative potential is applied to the memory gate and a positive potential is applied to the diffusion layer 201 on the side of the memory gate. This causes strong inversion in a region where the memory gate 901 and the diffusion layer 201 overlap with each other at the end of the diffusion layer. The strong inversion causes a band-to-band tunnel phenomenon and holes can be generated. The band-to-band tunnel phenomenon is reported, for example, by T. Y. Chan, et al. in IEEE International Electron Device Meeting, Technical Digest, pp 718 to 721, 1987. In the memory cell, the generated holes are accelerated in the direction of the channel, attracted by the bias of the memory gate and injected into the MONOS film to conduct the erasing operation. That is, the threshold value of the memory gate increased by the charges of the electrons can be lowered by the charges of the injected holes. This erasing system is characterized in that since the holes are generated at the end of the diffusion layer, holes are injected concentrically to the end of the memory gate 501 on the side of the diffusion layer.

(3) Upon retention, the charges are retained as the charges of the carriers injected into the insulative film MONOS. Since transfer of the carriers in the insulative film is extremely small and slow, charges can be retained favorably even when the voltage is not applied to the electrode.

(4) Upon reading, a positive potential is applied to the diffusion layer on the side of the selection gate and a positive potential is applied to the selection gate 502, to thereby turn on the channel 302 below the selection gate. Then, by applying an appropriate memory gate potential capable of distinguishing the difference of threshold values of the memory gate which are applied depending on writing and erasing states (that is, an intermediate potential for the threshold value between the writing state and the threshold value in the erasing state), retained charge information can be read out as a current.

FIG. 3 shows a cross-sectional structure of a memory cell for providing the prior art described above. FIG. 3 shows an example of the so-called split gate type cell structure. Such an example is shown, for example, in JP-A No. 2002-231829. To improve the scalability of a memory cell using the split gate type cell structure, memory gate fabrication by the so-called sidewall spacer using polycrystal silicon of high fabricability is useful. FIG. 3 shows a typical example. Diffusion layer electrodes 201 and 202 are formed to face each other in a semiconductor substrate 101. A selection gate 502 and a memory gate 501 are disposed corresponding to respective channels 205 and 206 formed between the diffusion layer electrodes 201 and 202. The selection gate 502 and the memory gate 501 are formed by way of gate insulative films 902 and 901, respectively. In this example, silicide layers 554, 555 are disposed over the diffusion layer electrodes 201 and 202 and the gates 501 and 502, respectively.

The structure is advantageous in that injection of holes can be facilitated by decreasing the gate length (Lmg) of the memory gate. However, when the structure is formed by utilizing a usual sidewall spacer, while the gate length can be reduced, this poses a problem in that the wiring resistance of the memory gate electrode is increased. The problem of the wiring resistance is unfavorable for integrated semiconductor nonvolatile memory cells. This is because the conductor layer for the gate has to be handled as wiring when the memory cells are arranged in an array. For example, increase of the gate resistance makes the bias supply instable, which gives a significant problem to the high-speed operation of the cell. In view of the above, to solve the problem, it may be conceivable to silicide the gate electrode formed of polycrystal silicon which has been used frequently in the existent CMOS in order to decrease the gate resistance.

FIG. 3 shows the state where an existent salicide process is applied. Silicide layers 554 and 555 are formed over the gates 501 and 502, respectively. As can be seen from the figure, the memory gate where the gate length (Lmg) is shorter than the gate length (Lcg) of the selection gate involves a problem in that the resistance can not be lowered sufficiently due to the size dependence of the silicide material. The countermeasure for the problem results in an additional problem. That is, when the silicide layer is formed to be large in thickness (xm) in order to lower the resistance of the gate conductor layer, the thicknesses of the silicide layers 254 and 255 for the respective diffusion layers 202 and 201 which have to be formed by the same step also increases. Accordingly, it is necessary to make the diffusion layers 201 and 202 further deeper. This deteriorates the scalability of the cell.

Further, in this example, since the memory gate is formed as a sidewall spacer by polycrystal silicon, when the diffusion layer electrodes 201 and 202 on the side of the semiconductor substrate and the upper portions of the gates 502 and 501 are silicided simultaneously, it may be probably that the diffusion layers, that is, the silicide 555 and the silicide 554 are short circuited to each other. To avoid the problem, a process of forming the material layer for silicidation so as to cover only the diffusion layers on the side of the semiconductor substrate has been described in JP-A No. 2002-231829. However, the method additionally poses a problem in that the resistance of both the selection gate and the diffusion layer cannot be lowered simultaneously.

On the other hand, to lower the resistance without using the siliciding reaction, it may be conceivable to form a memory gate by using a high melting metal such as tungsten. However, this not only makes the fabricability difficult compared with the case of using polycrystal silicon but also makes it impossible to form the source and drain diffusion layer electrodes by a self-alignment process by ion implantation using the gate as a mask. This is because the metal is injected from the gate used as a mask into the substrate due to the knock-on phenomenon caused by ion implantation.

SUMMARY OF THE INVENTION

It is therefore an object of the present invention to solve the foregoing problems and provide an insulated gate nonvolatile memory of a split gate structure having a memory gate with low-resistance.

The gist of the present invention is as described below. After fabrication of a memory gate from polycrystal silicon, only the memory gate is silicided, for example, by using an ONO film as a protective film. According to the process, the resistance of the memory gate can be lowered independently of the thickness of the silicide layer in an impurity diffusion region as a source or drain. The silicide layer of the memory gate can be formed to have a thickness greater than that of the silicide layer in the impurity diffusion region as the source or drain. Further, by maximizing the thickness of the silicide layer for the memory gate, the memory gate can be formed completely into a silicide layer. Accordingly, low gate resistance can be attained.

The gate length of the memory gates in the split gate memory cell can be reduced by forming the memory gate with the so-called sidewall which is formed by way of an insulative film on the sidewall of the selection gate. Accordingly, since carrier injection from the end of the memory gate on the side of the selection gate is facilitated and a material of sufficiently low resistance can be used irrespective of the short gate length, a memory gate with resistance sufficiently low in practical use can be formed. It is a typical embodiment that a stack of a first silicon oxide film, a silicon nitride film and a second silicon oxide film is used for the gate insulative film of a memory transistor in the split gate memory cell.

The equivalent circuit for the split gate memory cell of the invention is the same as that of FIG. 2. That is, in the basic embodiment, impurity diffusion layer electrodes are disposed to face each other in a silicon substrate and a selection gate and a memory gate are situated therebetween by way of gate insulative films. The channels are formed in the semiconductor substrate corresponding to the gates respectively. Further, the concept itself for the basic states of writing, erasing, retention and reading in the nonvolatile memory device of the invention is the same as that explained in the paragraphs of the Background.

Main various aspects of the invention are to be described below.

In accordance with the first aspect of the invention, it provides a nonvolatile semiconductor memory device having, on the main surface of a semiconductor substrate, a channel region, a first impurity region and a second impurity region situated on both sides thereof, a first gate electrode formed by way of a first gate insulative film over the channel region, and a second gate electrode formed as a thin layer by way of a separating insulative film on a lateral side of the first gate electrode on one of the first impurity region and the second impurity region and by way of a second insulative film over the channel region, and the second gate electrode is formed of silicide. The nonvolatile semiconductor memory device controls the potential to the first and the second gate electrodes and the first impurity region and the second impurity region and controls accumulation of charges to the second gate insulative film and reading out thereof.

In accordance with a second aspect of the present invention, expressing the invention in another way, there is provided a nonvolatile semiconductor memory device including a first insulated gate field effect transistor and a second insulated gate field effect transistor formed on a silicon substrate, with the first gate electrode of the first insulated gate field effect transistor and the second gate electrode of the second insulated gate field effect transistor extending in the same direction. Then, the silicon substrate is formed with, in the direction perpendicular to the extending direction of the first and the second gate electrodes, successively: a first diffusion layer electrode; a first channel opposed by way of a first gate insulative film to the first gate electrode and controlled thereby; a second channel opposed by way of a second gate insulative film to the second gate electrode and controlled thereby; and a second diffusion layer electrode. The gate insulative film of the second insulated gate field effect transistor has a charge retention function, and carriers are injected to the gate insulative film of the second insulated gate field effect transistor to thereby change a voltage characteristic of a current flowing between the first diffusion layer electrode and the second diffusion layer electrode by the second gate electrode by the charges of the carriers. In this invention it is extremely important that the second gate electrode includes a silicide thin layer formed on the lateral side of the first gate opposed to the channel direction on the side of the second diffusion layer electrode with an insulative film layer being put therebetween. A silicide thin layer of the second gate electrode is formed of nickel silicide as a most practical silicide material.

Further, the nonvolatile memory device of the invention is practical because the first gate electrode is formed of a stacked structure of a polycrystal silicon layer and a silicide layer, and the second gate electrode is formed of a single silicide material.

Usually, in the nonvolatile memory device according to the invention, the first diffusion layer electrode and the second diffusion layer electrode each has a silicide region. However, as will be shown specifically later, the step of silicidation of the second gate electrode and the step of silicidation of the first diffusion layer electrode and the second diffusion layer electrode are conducted in separate steps. This can satisfy the conditions of each silicide.

Then, the method of manufacturing the nonvolatile memory device according to the invention is to be described.

The manufacturing method according to the invention provides a method of manufacturing a nonvolatile semiconductor memory device in which a pair of first and second impurity regions are spaced apart from each other on a main surface of a substrate, and a first gate electrode and a second gate electrode are disposed between the first and the second impurity region each by way of a gate insulative film. The method includes the steps of forming a first gate insulative film on a silicon substrate, forming the first gate electrode on the first gate insulative film, forming a second gate insulative film on the silicon substrate, forming the second gate electrode on the second gate insulative film, replacing the second gate electrode with a metal material of low resistance, and forming a silicide layer on the first gate electrode.

Further, a more specific embodiment of the manufacturing method is as shown below.

The method is a method for manufacturing a nonvolatile semiconductor memory device in which a pair of first and second impurity regions are spaced apart from each other on a main surface of a substrate, and a first gate electrode and a second gate electrode are disposed between the first and the second impurity regions each by way of a gate insulative film. The method includes the steps of:

forming a first gate electrode by way of a first gate insulative film on a silicon substrate;

forming a second gate insulative film layer on a main surface of the semiconductor substrate prepared by the steps so far;

forming a polycrystal silicon layer over the second gate insulative film;

selectively etching the polycrystal silicon layer by anisotropic etching to thereby form a second gate electrode in the shape of a sidewall on at least one of a pair of lateral sides of the first gate electrode in the direction of the channel;

forming a pair of first and second impurity region in regions of the first and the second gate electrode;

forming a metal layer for siliciding the polycrystal silicon layer on the semiconductor substrate prepared by the steps so far;

siliciding the second gate electrode comprising the polycrystal silicon layer;

removing the unreacted layer for silicidation;

forming at least an insulative film on a pair of lateral sides of convex regions formed by both the electrodes of the first and the second gate in the direction of the channel; and converting at least a portion of the pair of first and second impurity region into a metal of lower resistance.

In this embodiment, it is practical that the step of converting into the metal of lower resistance is a silicidation step. Further, it is practically useful that the step of forming a pair of the first and the second impurity region comprises conducting ion implantation using the first and the second gate electrode region as mask regions to thereby form a pair of the first and the second impurity region in a self-alignment manner.

In view of the purpose of the invention, in the step of siliciding the second electrode, it is particularly preferred to silicide the second gate electrode entirely. The step of lowering the resist, that is, the step of silicidation in a specific embodiment can be modified as below for the sake of practical convenience. At first, the step of lowering the resistance of metal can be carried out together with lowering of the resistance of metal above the first gate electrode.

Further, after the step of forming the second gate electrode in the shape of a sidewall, the thickness of the second electrode in the shape of the side wall is reduced (that is etched), the second gate electrode and the impurity region as the source or the drain are spaced apart from each other at an appropriate distance. In this state, the resistance of metal for the second gate electrode and the impurity region as the source or drain can be lowered in one and the same step.

The invention provides a novel structure of an insulated gate nonvolatile semiconductor memory device having a split gate, which can lower the resistance of the gate electrode, and the impurity region as the source and the drain of a memory transistor, while satisfying the requirements thereof, as well as a manufacturing method thereof.

Further, the structure described above is suitable to the arrangement of the memory cell array.

DESCRIPTION OF THE ACCOMPANYING DRAWINGS

DESCRIPTION OF PREFERRED EMBODIMENTS OF THE INVENTION

Embodiment 1

The present invention is to be described specifically with reference to embodiments thereof. At first, the method of formation and the structure according to the invention are to be described focusing on a memory gate as a principal portion thereof.

FIGS. 4 to 10 are schematic cross-sectional views of a semiconductor device according to a first embodiment of the invention.

Figure 1:
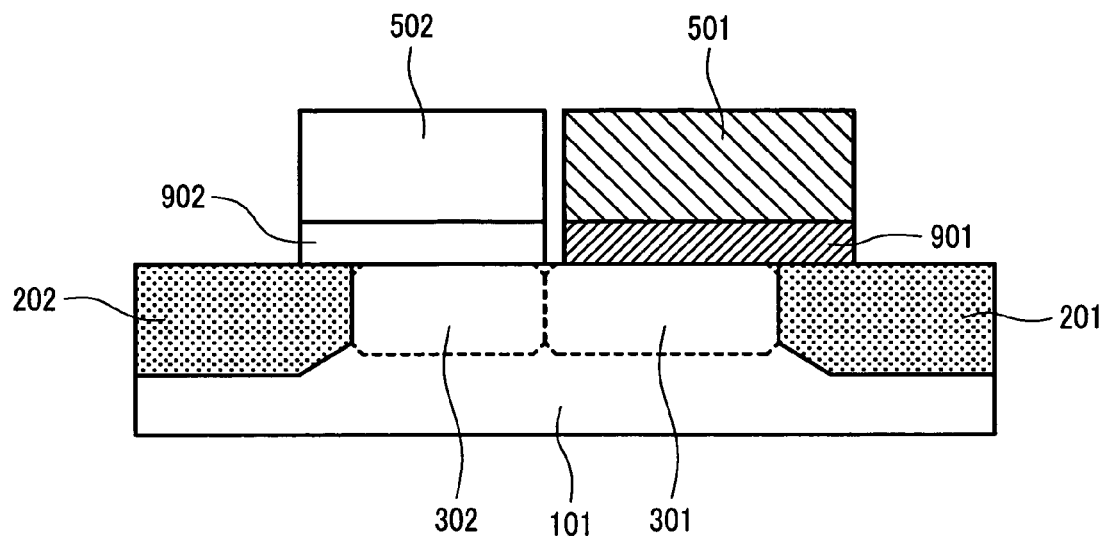
FIG. 1 is a cross sectional view of a typical device for explaining a memory cell structure.
Figure 2:
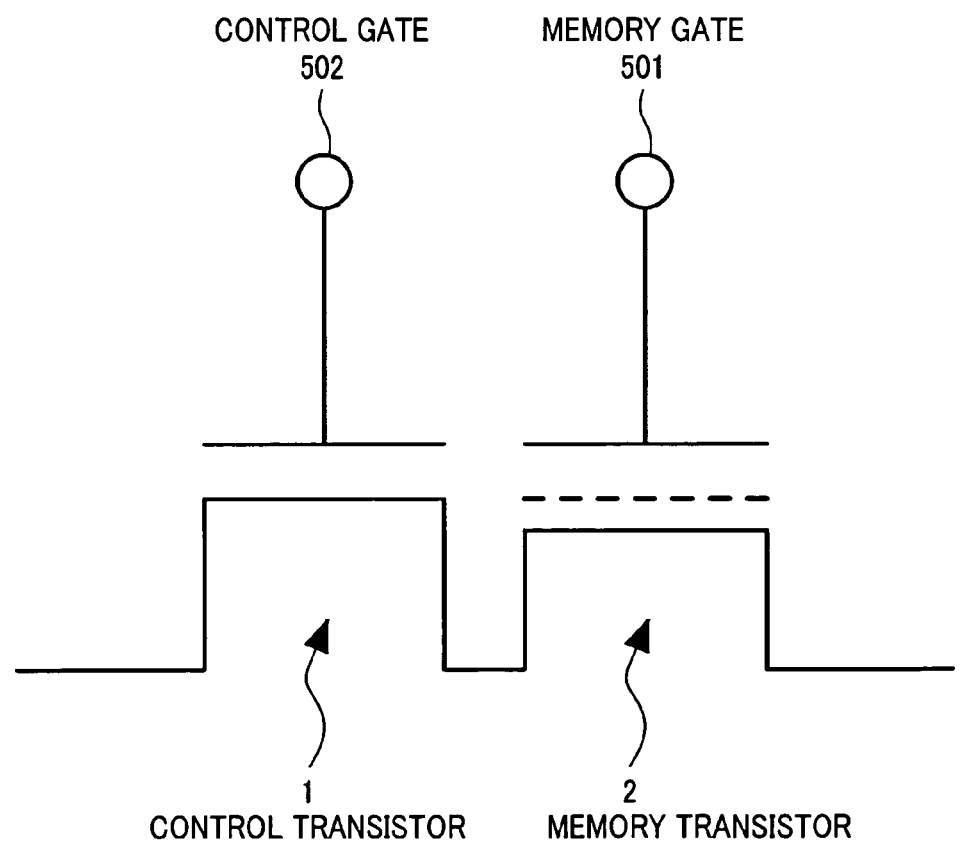
FIG. 2 is an equivalent circuit diagram for explaining a memory cell structure.
Figure 3:
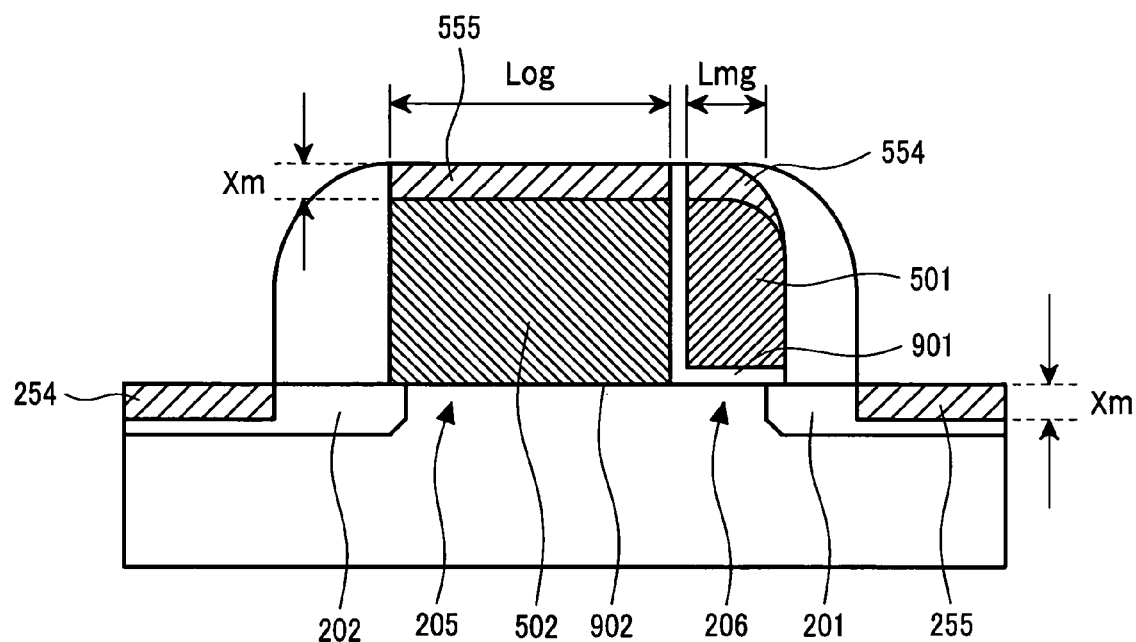
FIG. 3 is a cross-sectional structural view of a device for explaining the problem in an existent structure.
Figure 4:
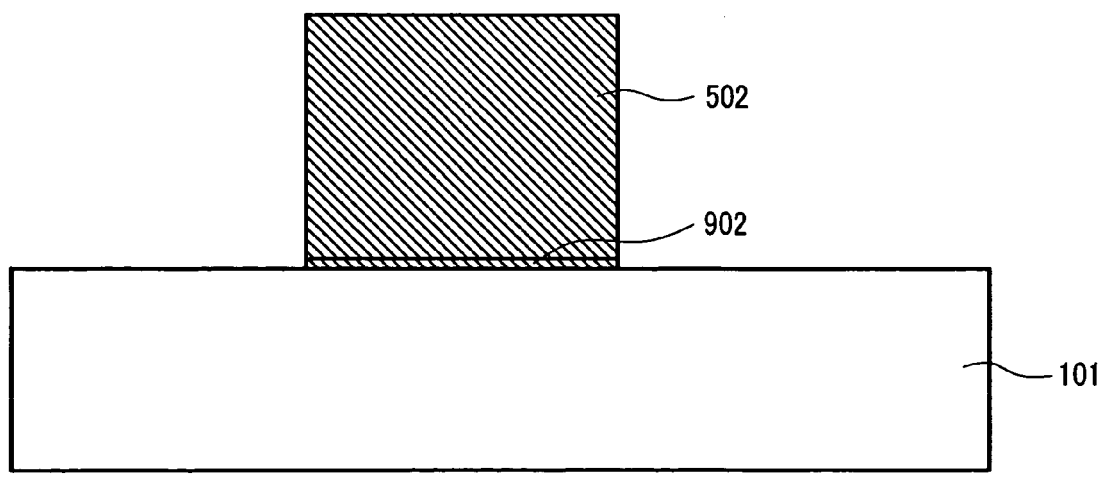
FIG. 4 is a cross-sectional structural view for explaining a device-manufacturing step.

In accordance with a usual manufacturing method of a semiconductor device, a semiconductor substrate having a well 101 is provided. After formation of a gate oxide film 902 of 3 nm thick in the surface of an active region in the well 101, phosphorus-doped polycrystal silicon is deposited to a thickness of 200 nm by a CVD method. Then, the polycrystal silicon layer is fabricated into a desired shape by using usual lithography to form a selection gate 502 (FIG. 4).

Figure 5:
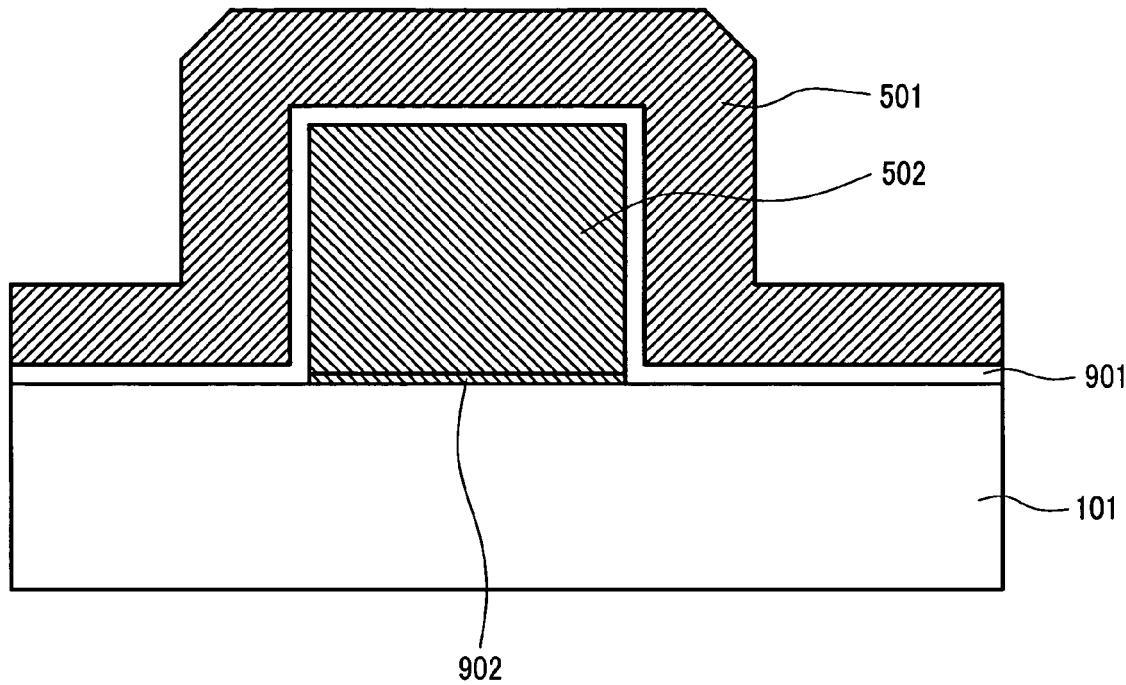
FIG. 5 is a cross-sectional structural view for explaining a device-manufacturing step.

Then, after formation of a stacked structure 901 of a silicon oxide film, a silicon nitride film and a silicon oxide film as a charge retention layer (hereinafter simply referred to as ONO film), phosphorus-doped polycrystal silicon 501 is deposited to a thickness of 60 nm (FIG. 5). In this step, the thicknesses of the insulative films constituting the stacked structure are set, for example, to the ranges of from 2 to 7 nm, 5 to 12 nm, and 5 to 10 nm from the side of the substrate, respectively. It will be apparent that the film thicknesses may be optimized depending on the application use. In the figure, the stacked film is depicted not for every layer but denoted by reference numeral 901. In the stack of the first silicon oxide film, the silicon nitride film and the second silicon oxide film, the first silicon oxide film on the side of the substrate is an insulative film for forming a potential barrier between the substrate and the first silicon oxide film, the intermediate silicon nitride film is an insulative film for forming a carrier capturing level on at least one of the boundary between the intermediate silicon nitride film and each of the first and the second silicon oxide film, and the silicon nitride film and, further, the second silicon oxide film is an insulative film for forming a potential barrier between the second gate electrode and the second silicon oxide film.

Figure 6:
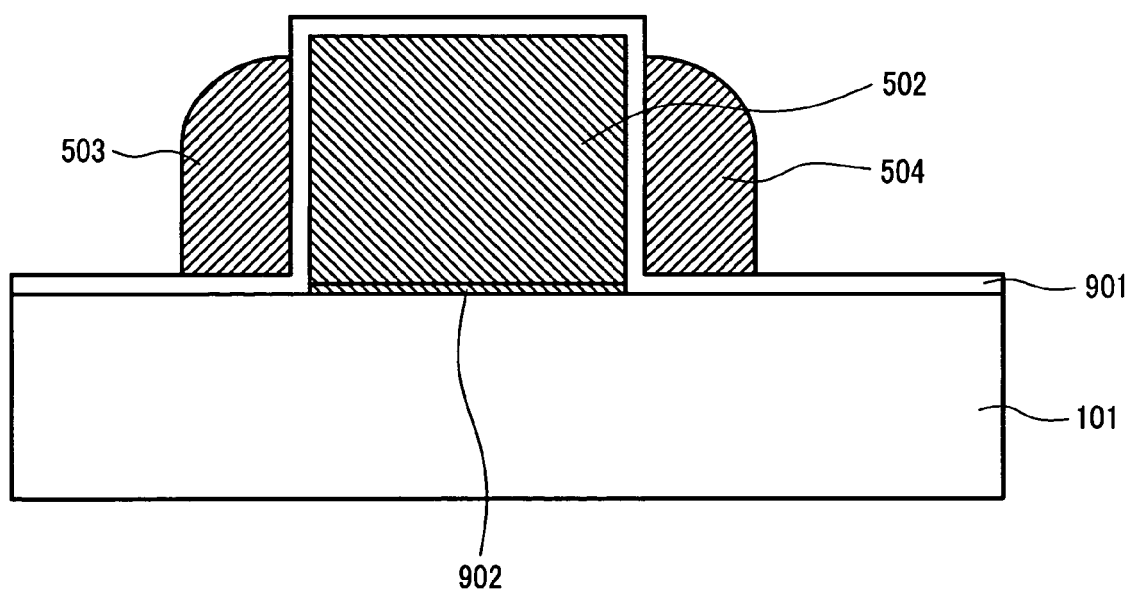
FIG. 6 is a cross-sectional structural view for explaining a device-manufacturing step.

Spacers 503 and 504 are formed on the lateral sides of the selection gate 502 by anisotropically etching the polycrystal silicon 501 in the direction vertical to the surface of the substrate (FIG. 6).

Figure 7:
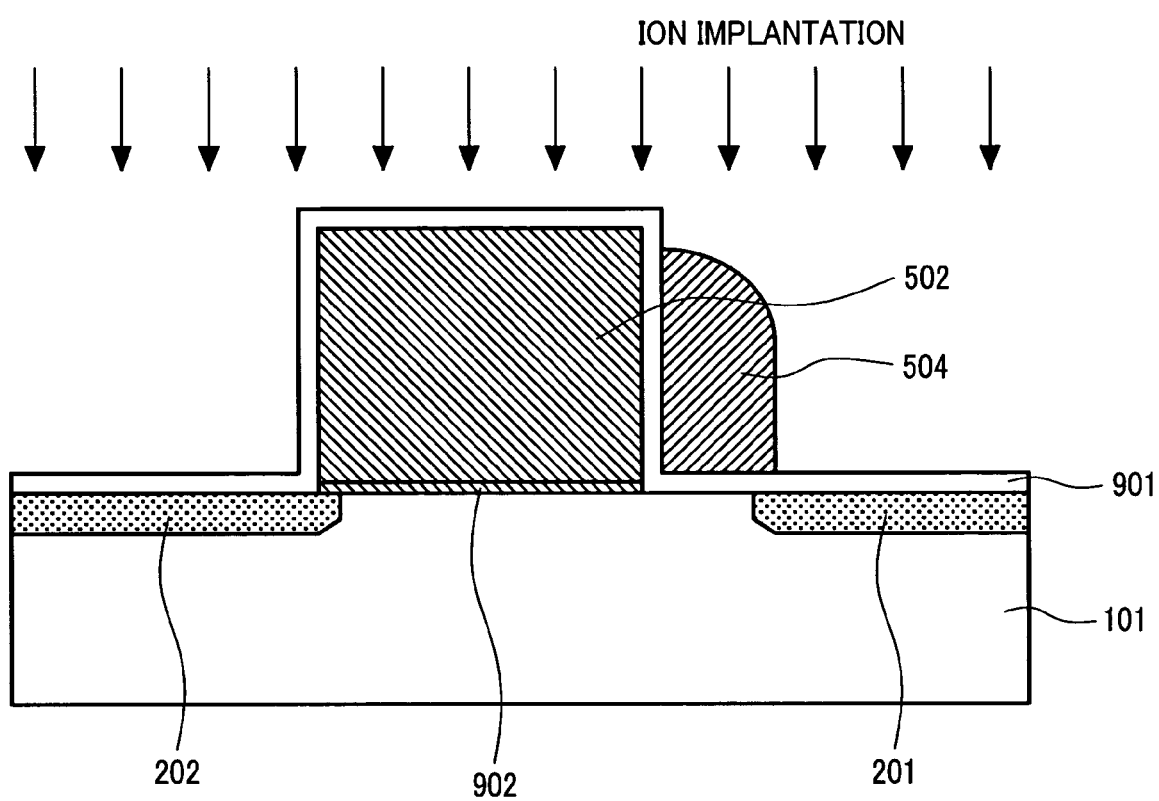
FIG. 7 is a cross-sectional structural view for explaining a device-manufacturing step.

The spacer 503 on one side is removed by etching using the underlying ONO film 901 as a stopper. Then, arsenic is ion implanted using the selection gate 502 and the region for the polycrystal silicon spacer 504 as masks, to form diffusion layer electrodes 201 and 202 (FIG. 7). In this step, since each mask is made of polycrystal silicon, a heat treatment for usual doping and activation can be adopted.

Figure 8:
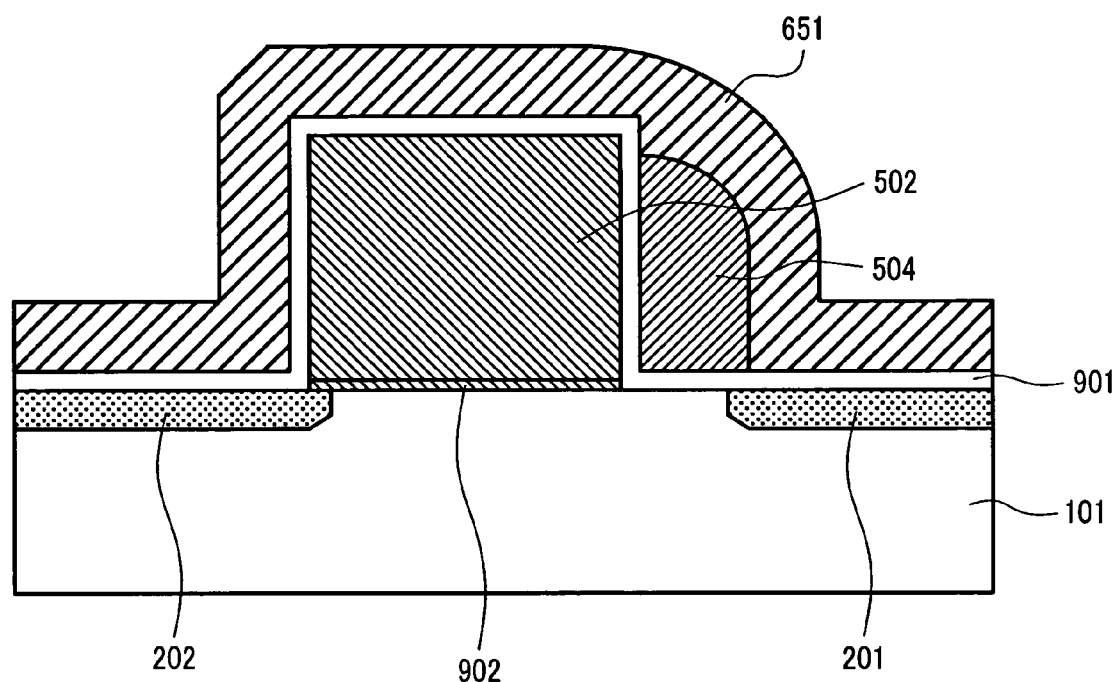
FIG. 8 is a cross sectional structural view for explaining a device-manufacturing step.

A stacked film 651 of nickel and titanium nitride is deposited to thicknesses of 40 nm and 10 nm respectively by a sputtering method (FIG. 8).

Figure 9:
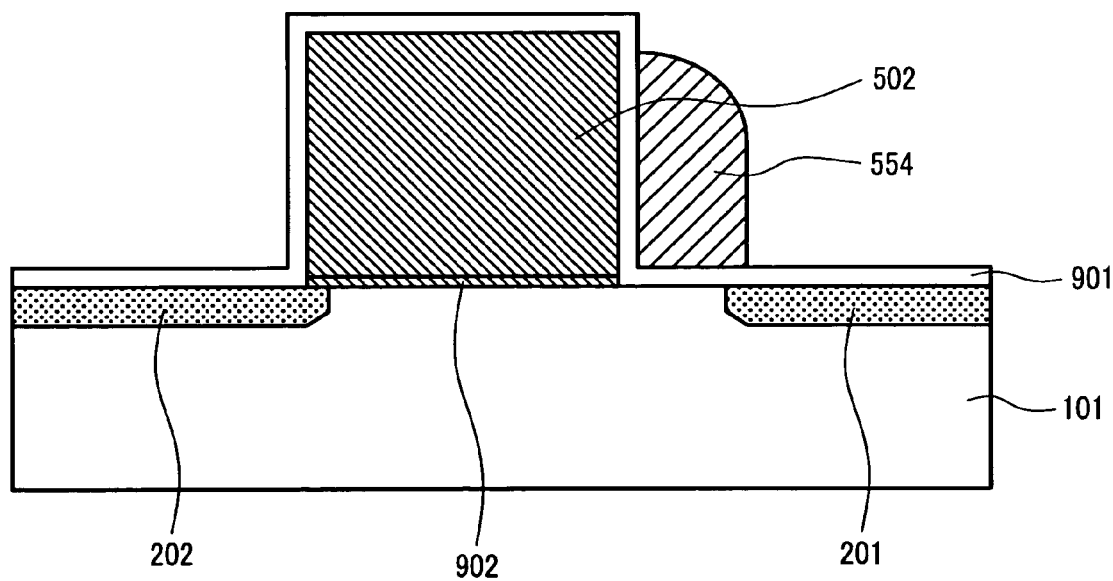
FIG. 9 is a cross-sectional structural view for explaining a device-manufacturing step.

Then, a heat treatment is applied at 500° C. to react the polycrystal silicon 501 in contact with the nickel layer in the stacked film 651 to form nickel silicide 554. Then, unreacted nickel, etc. are removed by wet etching using hydrochloric acid and aqueous hydrogen peroxide (FIG. 9). With the process, a memory gate 554 formed of nickel silicide can be obtained. In this step, since the diffusion layer electrodes 201 and 202 and the selection gate 502 are covered with the ONO film 901, they do not take place the siliciding reaction.

As seen in this embodiment, in the invention, the gate of the second transistor is constituted with the so-called spacer formed on the lateral side of the first gate with the insulative film layer being put therebetween, and the gate of the second transistor is formed of a single silicide material.

Figure 10:
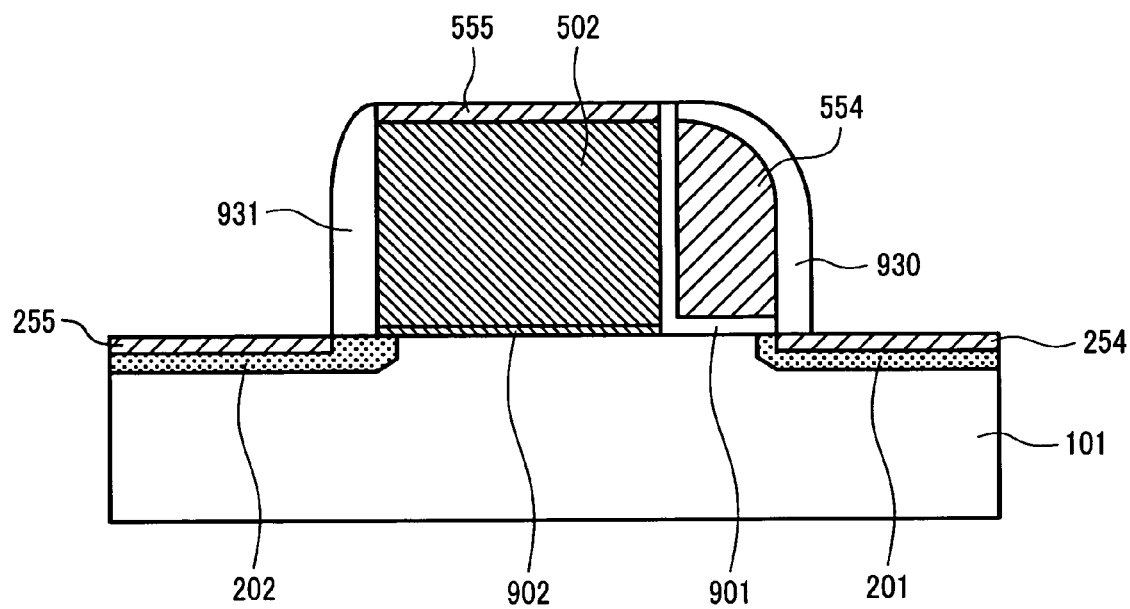
FIG. 10 is a cross-sectional structural view for explaining a device-manufacturing step.

After deposition of a silicon oxide film 930 by a CVD method, anisotropic etching is applied vertically to the surface of the substrate to expose the regions over the selection gate and the diffusion layer electrode over the substrate, which are again silicided by using nickel (FIG. 10). Thus, silicide layers 254, 255 and 555 are formed over the diffusion layers 201 and 202 and the selection gate 502, respectively. In this stage, since the memory gate 554 has already been silicided completely, it can be present stably even if the heat treatment is applied. In this way, silicidation is conducted on the upper portion of the first gate 502 and the diffusion layer electrode portions 201 and 202 of the substrate (the formation of silicide layers 555, and 254 and 255).

As has been described above specifically, it is possible to provide a semiconductor memory device in which the silicidation for the second gate and that for the upper portion of the first gate 502 and the diffusion layer electrode portions 201 and 202 of the substrate satisfy the respective characteristics required for them.

Figure 11:
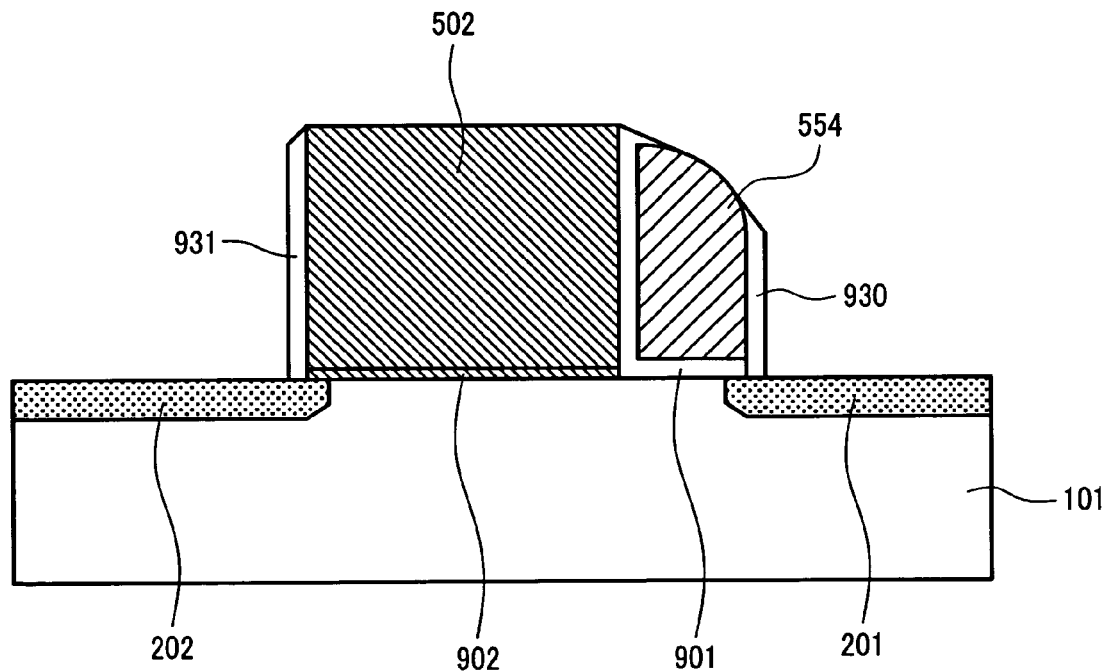
FIG. 11 is a cross-sectional structural view for explaining a device-manufacturing step.

In the process according to the invention, the silicidation step is separated into two steps. Since each of the steps is conducted by using the self-alignment process adopting the existent spacer process, the resistance can be lowered at a good matching property. Further, while the oxide film 930 covers the memory gate in FIG. 10, the oxide film 930 may not necessarily be present above the memory gate 554 to remain open as shown in FIG. 11 in view of the purport of the invention.

As has been described above specifically, in a nonvolatile semiconductor device having a selection gate and a memory gate for retaining charges in the insulative film in which the memory gate is formed of the sidewall spacer, the resistance of the memory gate can be lowered by forming the memory gate of a single metal material. While an example of forming the memory gate of the single metal material is shown in this embodiment, it is not always necessary that the gate is formed of the single metal material. The memory gate may be made of a composite material of polycrystal silicon and silicide so long as the thickness of the silicide layer of the memory gate is greater than that of the silicide layer formed over the diffusion layers 201 and 202 and the selection gate 502. The thickness of the silicide layer referred to herein means the thickness in the direction of the normal line relative to the surface of a curved portion of the sidewall on the sidewall spacer.

According to this embodiment, the resistance of the memory gate can be decreased and, in addition, the selection gate and the diffusion layer electrode can be silicided by using a metal different from the material used for decreasing the resistance of the memory gate. Further, since the memory gate is silicided before the silicidation of the selection gate and the diffusion layer electrode, it is possible to promote the silicidation of the memory gate to further lower the resistance by the heat treatment of the silicidation for the selection gate and the diffusion layer electrode.

Embodiment 2

This embodiment illustrates a manufacturing step for a semiconductor integrated circuit including a memory cell portion and a memory peripheral circuit portion. FIGS. 12 to 23 are schematic cross-sectional views showing a semiconductor device of this embodiment in the order of steps. This embodiment shows the state of forming the memory cell portion and the memory peripheral circuit portion, particularly, a high voltage withstanding device portion and a usual device portion since high voltage withstanding is necessary, for example, in writing.

Figure 12:
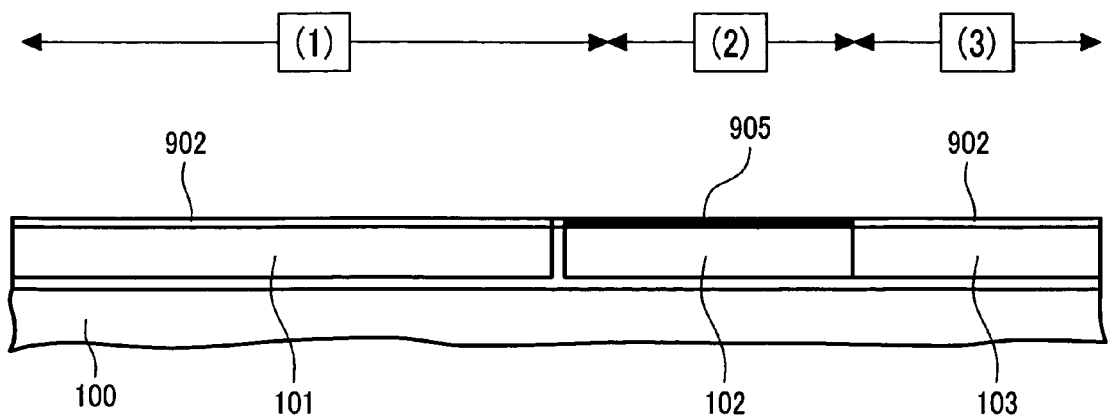
FIG. 12 is a cross-sectional structural view for explaining a second device-manufacturing step of the invention.
Figure 13:
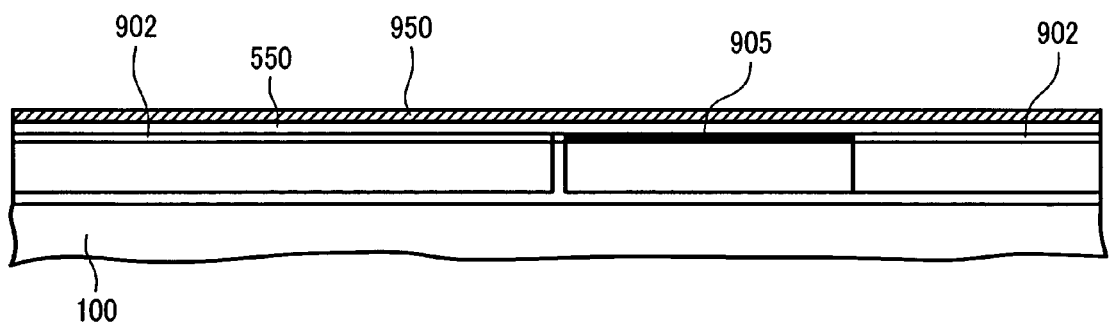
FIG. 13 is a cross-sectional structural view for explaining a second device-manufacturing step of the invention.
Figure 14:
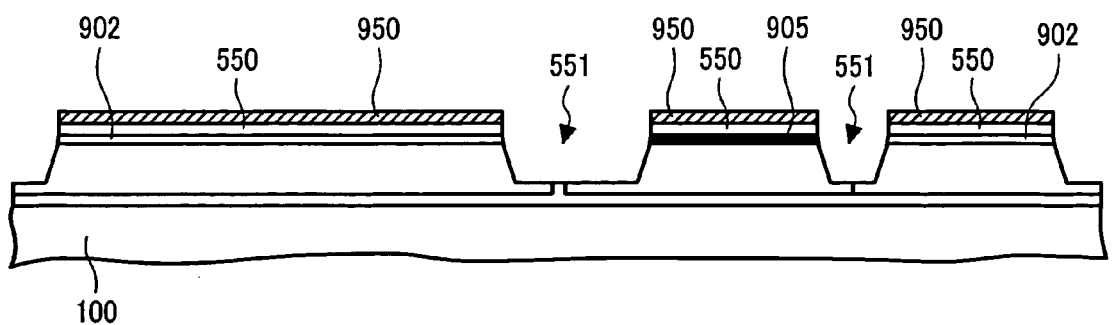
FIG. 14 is a cross-sectional structural view for explaining a second device-manufacturing step of the invention.
Figure 15:
FIG. 15 is a cross-sectional structural view for explaining a second device-manufacturing step of the invention.
Figure 15:
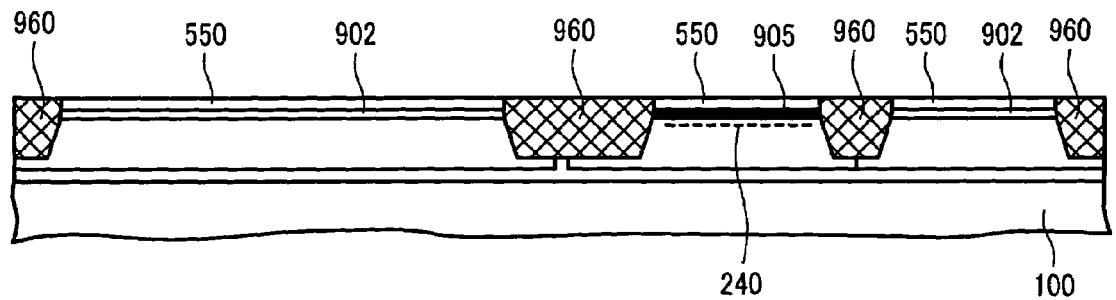

In FIG. 12, each of the regions for the memory cell portion (1) and the memory peripheral circuit portion, a high voltage withstanding memory portion (2) requiring a high voltage, particularly, in writing and a usual device portion (3) are depicted each by the reference described above. FIGS. 13 and 14 lack the indications for the regions but the corresponding regions are the same as those in FIG. 12. Further, FIG. 15 depicts more specific roles of the respective regions (1), (2) and (3), that is, as MONOS (1), peripheral high voltage circuit portion (2), and fine CMOS (core CMOS) (low voltage circuit) portion (3), respectively. FIGS. 16 to 23 lack particular indications for the regions but the corresponding regions are the same as those in FIG. 15.

While NMOS is taken into consideration in the description, CMOS is formed actually, for example, by a known ion implantation method. Further, a process of forming the gate insulative film before formation of the device isolation region in order to provide favorable device characteristics. However, since the structure of giving a high electric field according to the invention is substantially not based on the method of forming the device isolation region, the step of forming the gate insulative film can be conducted after application of the device isolation step generally used so far, for example, STI (Shallow Trench Isolation) or LOCOS.

After thermal oxidization for the surface of the substrate, wells 101, 102, and 103 are formed in the surface of the substrate by an ion implantation method. After the thermal oxide film on the surface of the substrate is once removed, it is removed again by conducting sacrificial oxidation to form gate oxide films 905 and 902. The formation of the oxide films uses a two-stage oxide film forming step. At first, since the high voltage withstanding portion (2) has a gate insulative film 905 of the largest thickness, oxidation is conducted conforming the film thickness thereof, while other portions are removed by using a photolithographic method. Then, oxidation is conducted conforming the other regions (1) and (3) to form an insulative film 905 of 3 nm thick. During the second oxidation, the thickness of the gate insulative film 905 at the high voltage withstanding portion formed at first may be also increased. Accordingly, the initial oxidation is conducted while the change of the film thickness is allowed. Further, in a case where more kinds of film thickness are necessary, they can be formed by conducting the steps repetitively. Further, it is known the lowering of breakdown voltage degradation occurs at the oxide film in contact with the photoresist. Then, a thin oxide film of about 5 nm thick may be deposited by a CVD method before the application of the photoresist. Since the CVD film has a higher etching rate to fluoric acid compared with the thermal oxide film, if deposited, it can be removed easily at the time of removing the gate insulative film for the unnecessary portions (FIG. 12).

After formation of the gate insulative film, polycrystal silicon 550 is deposited to 30 nm thick and a silicon nitride film (950) is deposited to have a thickness of 50 nm by a CVD method (FIG. 13).

A device isolation region is patterned to etch the nitride film 950, the polycrystal silicon 550, the gate insulative films 905, 902, and the substrate by 300 nm to form trenches 551 (FIG. 14).

After thermal oxidization of the exposed surface of the silicon substrate by about 10 nm, a silicon oxide film is deposited to 500 nm by a CVD method. The silicon oxide film is polished by a CMP method to conduct planarization so as to expose the surface of the deposited nitride film and an oxide film 960 is filled in the inside of the trench 551. Further, the nitride film 950 on the protruding surface of the substrate is removed by wet etching. If necessary, impurities 240 may be ion implanted to the channel surface for setting a threshold value. Reference numeral 240 in the figure corresponds to the high voltage withstanding portion. A selection gate of the memory cell may however be used and the threshold value of the selection gate can be set, for example, to provide a current value of $10^{-9}$ A/μm in the off state of: Vcg=0 V (FIG. 15)

Figure 16:
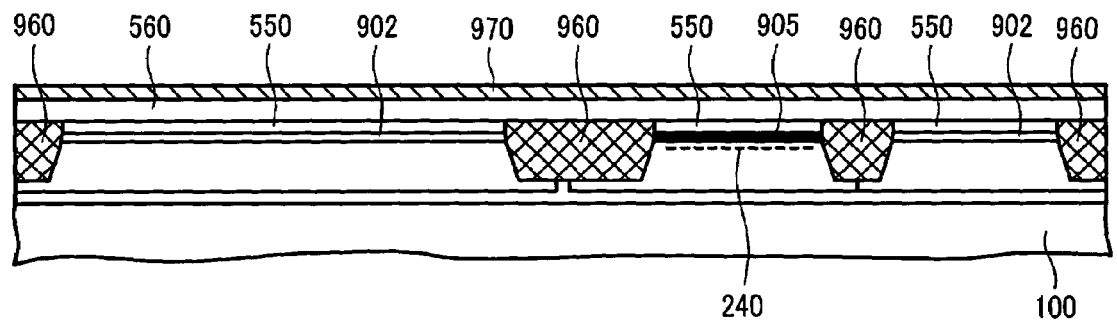
FIG. 16 is a cross-sectional structural view for explaining a second device-manufacturing step of the invention.

Polycrystal silicon 560 is deposited to 150 nm, phosphorus is doped at high concentration to the NMOS region and then an oxide film 970 is laminated to 50 nm by a CVD method (FIG. 16).

Figure 17:
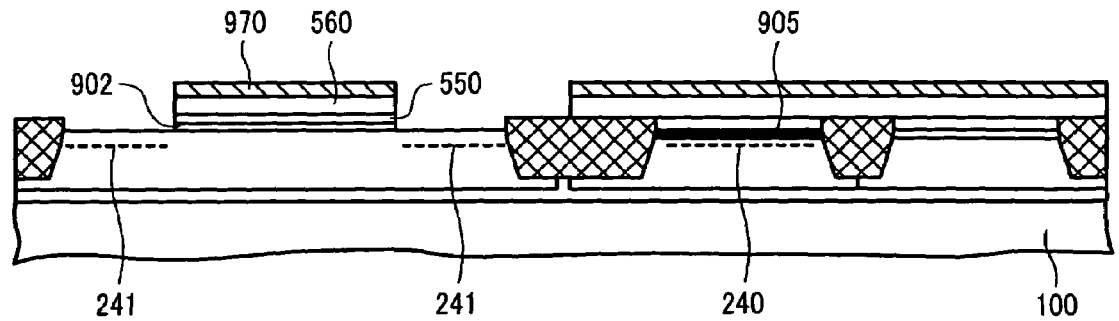
FIG. 17 is a cross-sectional structural view for explaining a second device-manufacturing step of the invention.

The stacked film of the oxide film 970, the polycrystal silicon 560 and 550 of the memory cell on the side of forming the memory gate are etched into a predetermined shape. When p-type impurities 241 are ion implanted using the pattern as a mask, it is possible to increase the electric field due to the PN junction relative to the diffusion layer to be formed subsequently and to set a threshold value (FIG. 17).

Figure 18:
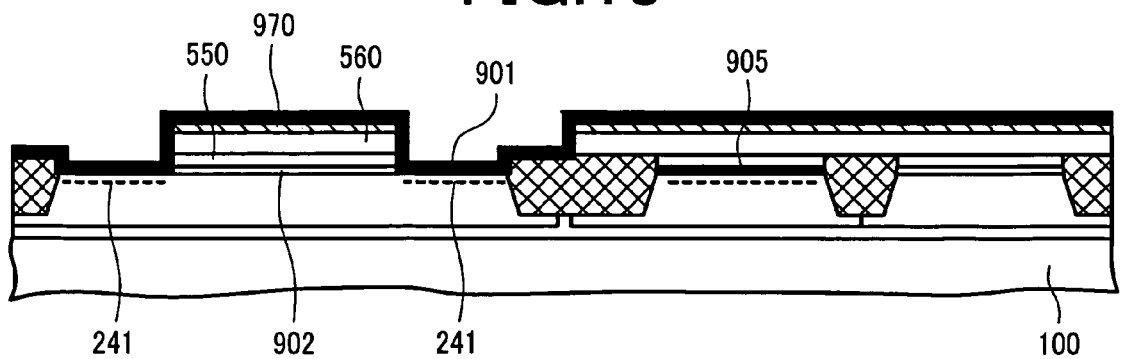
FIG. 18 is a cross-sectional structural view for explaining a second device-manufacturing step of the invention.

After sacrificial oxidization of the surface of the semiconductor substrate prepared so far, a silicon oxide film is formed to have a thickness of 4 nm by thermal oxidation. Then, a silicon nitride film is deposited to have a thickness of 8 nm and a silicon oxide film is deposited to have a thickness of 7 nm. In the figure, the stacked film is denoted by reference numeral 901. The last oxide film is formed as a high voltage withstanding film by oxidation of the nitride film. In this process, when an ISSG (In-Situ Steam Generation) oxidation method is adopted in the formation of the silicon oxide film of the lower layer, the difference of the growing rate can be decreased even over polycrystal silicon and single crystal silicon containing a great amount of impurities. Accordingly, a smooth film shape can be obtained. Since the constitution of the film thickness varies depending on how to use the semiconductor device to be formed, only the typical constitution is shown here. For example, the charge retention time can be made longer by increasing the thickness of the oxide film situated above and below. In this case, a characteristic with decreased read current is obtained (FIG. 18).

After deposition of phosphorus-doped polycrystal silicon to a thickness of 100 nm by a CVD method, etching is applied by so much as the thickness of the deposited film, so that a polycrystal silicon spacer as the memory gate 501 is formed on the lateral side of the selection gate. Further, in the spacer fabrication, a lead portion is patterned by a photoresist. In this case, the film thickness of polycrystal silicon can determine the memory gate length. The gate length can be decreased by reducing the film thickness. Since the channel controllability and the writing erasing characteristic are in a trade-off relation, the thickness of the deposition film is preferably from 30 to 150 nm. In a case where the gate length of the selection gate is about 200 nm, the film thickness is preferably from 80 to 100 nm. Further, after the step described above, polycrystal silicon in unnecessary portions can be removed.

Figure 19:
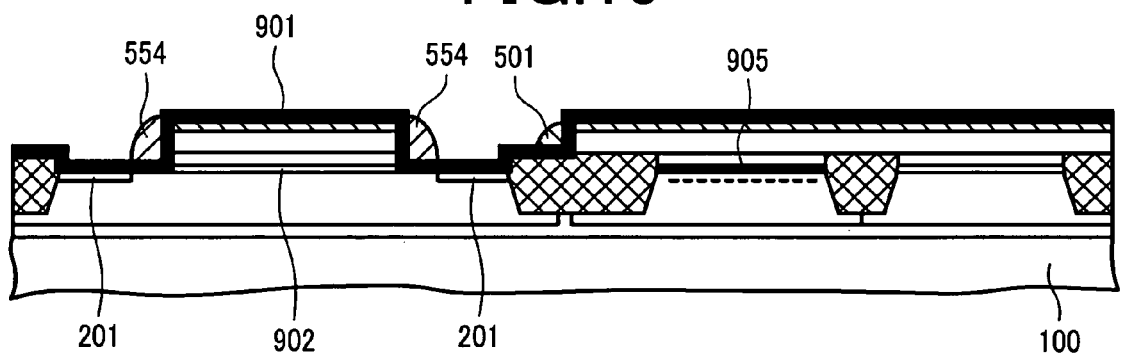
FIG. 19 is a cross-sectional structural view for explaining a second device-manufacturing step of the invention.

When arsenic ion implanted by $1 \times 10^{15}$ cm$^{-2}$ at an acceleration electric field of 10 keV using the spacer and the gate as the mask, the diffusion layer 201 on the side of the memory gate can be formed selectively. Silicidation using nickel is applied to the thus prepared substrate in the same manner as in the first embodiment to obtain a memory gate 554 by nickel silicidation (FIG. 19).

Figure 20:
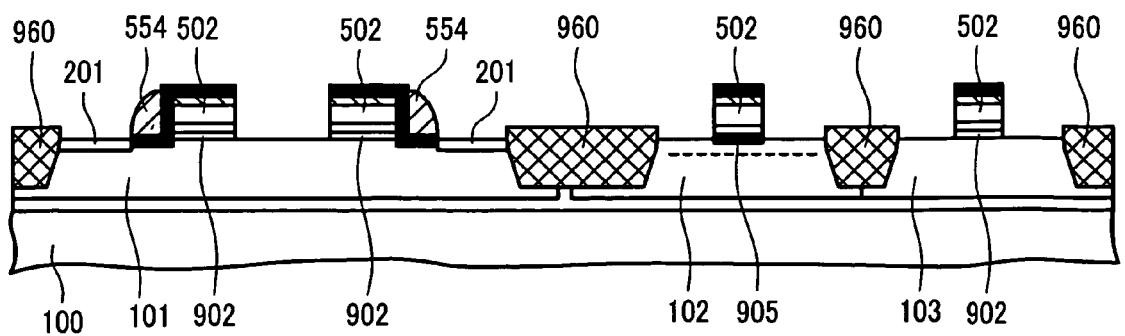
FIG. 20 is a cross-sectional structural view for a explaining device-manufacturing step.

After doping of impurities to the gate in the PMOS region, the selection gate and the peripheral transistor gate 502 are fabricated (FIG. 20).

Figure 21:
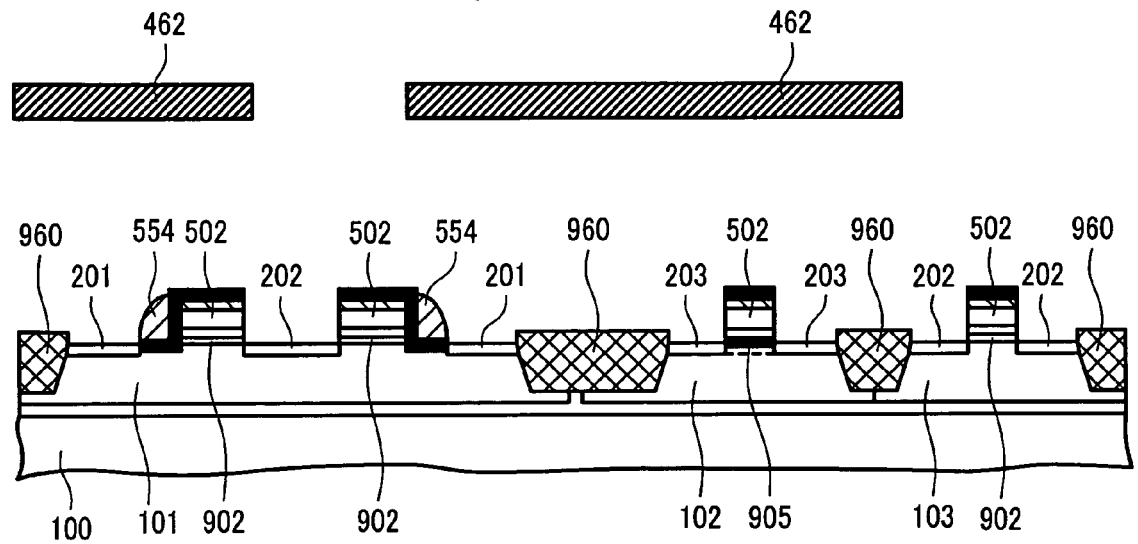
FIG. 21 is a cross-sectional structural view for a explaining device-manufacturing step.

Arsenic is doped by ion implantation to form impurity diffusion layer electrodes 202 and 203 as source and drain electrodes. When ion implantation is applied to the diffusion layer on the side of the selection gate, knock-on of the metal material can be avoided by covering a resist 462 over the memory gate (FIG. 21).

Figure 22:
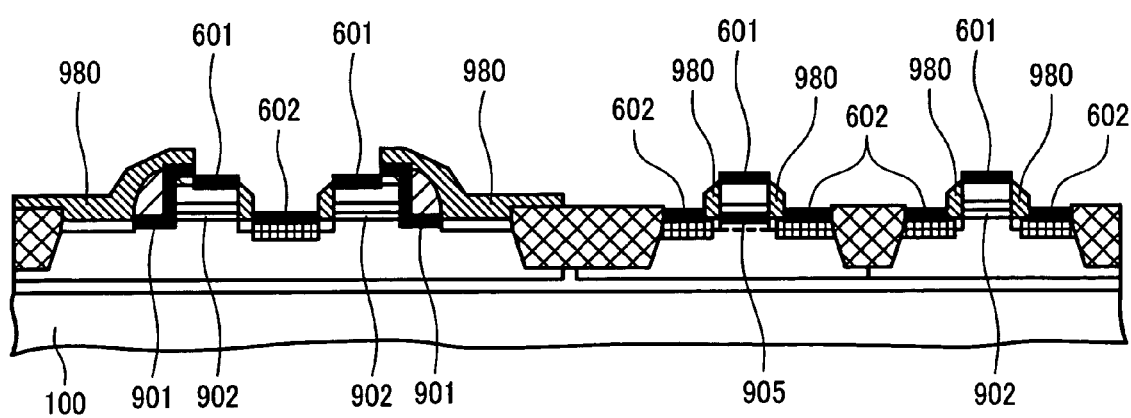
FIG. 22 is a cross-sectional structural view for a explaining device-manufacturing step.

After deposition of an oxide film to 80 nm, etching is applied to form a spacer 980 on the lateral side of the gate and expose polycrystal silicon of the gate electrode. In this case, the memory gate portion can be covered by patterning. A silicide layer is formed by the known silicidation method using nickel. This embodiment shows an example of forming the spacer with no patterning and defining the silicide forming portion by further depositing a thin oxide film, thereby making it possible to conduct fine fabrication (FIG. 22).

Figure 23:
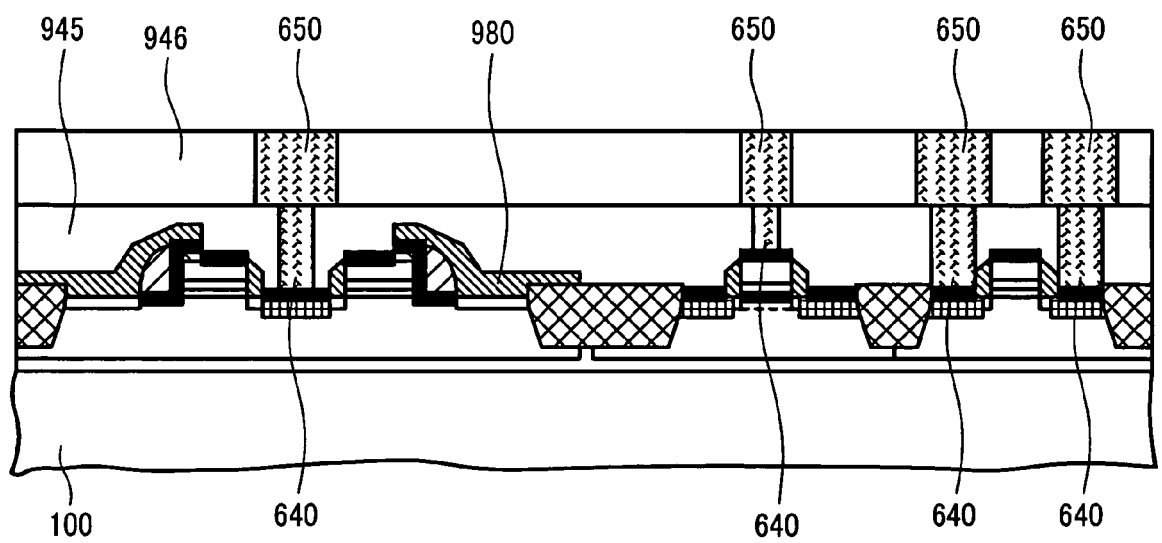
FIG. 23 is a cross-sectional structural view for a explaining device-manufacturing step.

FIG. 23 shows formation of the known metal wiring. It shows deposition of interlayer insulative films 945 and 946, contact plugs 640, and wirings 650. Subsequently, an integrated semiconductor chip is formed by conducting the known wiring steps.

The process in FIGS. 12 to 23 shows an example of using the spacer 980 as a cover when the selection gate is silicided. By the use of the structure, the lowering of the memory gate resistance according to the invention can be attained using a silicide material such as titanium, cobalt, or molybdenum, more liable to short-circuit compared with nickel. Further, the selection gate and the diffusion layer electrode can be silicided by using a metal different from the silicide material used for lowering resistance of the memory gate.

Since the present invention can provides a semiconductor device with higher performance by using only the existent semiconductor process, it has higher applicability.

The main numerals in the drawings are as follows: 101,102,103:well, 201,202,203:diffusion layer electrode, 240,241,242,244:ion implantation region, 301,302,303:region marker, 462:mask pattern, 501: memory gate, 502:gate, 505,506,550,560:polycrystalline silicon, 254,255,554,555, 601,602:silicide layer, 640,650:matal wiring, 651: matal layer, 901:memory gate insulator, 902,905:gate insulator, 950:silicon nitride layer, 930,945,946,960,970,980:insulating layer

What is claimed is:

1. A method of manufacturing a nonvolatile semiconductor memory device in which a pair of first and second impurity regions are spaced apart from each other on a main surface of a substrate, and a first gate electrode and a second gate electrode are disposed between the first and second impurity regions, each by way of a gate insulative film, the method comprising the steps of:

forming a first gate insulative film on a silicon substrate;
forming the first gate electrode over the first gate insulative film;
forming a second gate insulative film on the silicon substrate;
forming the second gate electrode over the second gate insulative film,
converting the entire second gate electrode to a metallic material of lower resistance; and
forming a silicide layer on the first gate electrode.

2. A method of manufacturing a nonvolatile semiconductor memory device in which a pair of first and second impurity regions are spaced apart from each other on a main surface of a substrate, and a first gate electrode and a second gate electrode are disposed between the first and second impurity regions, each by way of a gate insulative film, the method comprising the steps of:

forming a first gate electrode by way of a first gate insulative film on a silicon substrate;

forming a second gate insulative film layer on a main surface of the semiconductor substrate prepared by the steps so far;

forming a polycrystal silicon layer on the second gate insulative film;

selectively etching the polycrystal silicon layer by anisotropic etching to thereby form a second gate electrode in the shape of a sidewall on at least one of a pair of lateral sides of the first gate electrode in the direction of a channel;

forming a pair of first and second impurity regions in regions of the first and second gate electrodes;

forming a metal layer for siliciding the polycrystal silicon layer on the semiconductor substrate prepared by the steps so far;

siliciding the second gate electrode comprising a portion of the polycrystal silicon layer;

removing an unreacted metal layer for silicidation;

forming at least an insulative film on a pair of lateral sides of the first and the second gates in the direction of the channel; and converting a portion of at least one of the pair of first and second impurity regions into a metallic material of lower resistance at a different timing from the step of siliciding the second gate electrode.

3. A method of manufacturing a nonvolatile semiconductor memory device according to claim 2, wherein the step of converting into the metal of lower resistance is a silicidation step.

4. A method of manufacturing a nonvolatile semiconductor memory device according to claim 2, wherein the step of forming the pair of first and second impurity regions comprises conducting ion implantation using the first and second gate electrodes as mask regions to thereby form a pair of the first and second impurity regions in a self-alignment manner.

5. A method of manufacturing a nonvolatile semiconductor memory device according to claim 2, wherein the step of siliciding the second gate electrode comprises siliciding the entire second gate electrode.

6. A method of manufacturing a nonvolatile semiconductor memory device according to claim 2, wherein the step of converting into the lower resistance metal also includes converting an upper portion of the first gate electrode into a lower resistance metal.

7. A method of manufacturing a nonvolatile semiconductor memory device according to claim 2, further comprising the step of reducing a thickness of the second gate electrode to be silicided, after the step of forming the second gate electrode in the shape of the side wall.

8. A method of manufacturing a nonvolatile semiconductor memory device according to claim 2, wherein the second gate insulative film is a stack of a first silicon oxide film, a silicon nitride film and second silicon oxide film.

9. A method of manufacturing a nonvolatile semiconductor memory device having a first semiconductor region and a second semiconductor region formed in a semiconductor substrate and a first gate electrode and a second gate electrode formed on the semiconductor substrate between the first semiconductor region and the second semiconductor region, comprising the steps of:

forming a first gate electrode on the semiconductor substrate;

forming a first insulative film on a surface of the first gate electrode and a surface of the semiconductor substrate;

forming a second gate electrode by way of the first insulative film on a sidewall of the first gate electrode;

siliciding a surface of the second gate electrode; and siliciding a surface of the first semiconductor region after the step of siliciding the surface of the second gate electrode.

* * * * *